(12) United States Patent
Voelkel

(10) Patent No.: US 6,420,990 B1
(45) Date of Patent: Jul. 16, 2002

(54) PRIORITY SELECTION CIRCUIT

(75) Inventor: Eric H. Voelkel, Ben Lomond, CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/272,710

(22) Filed: Mar. 19, 1999

(51) Int. Cl.[7] ................................................ H03M 1/36
(52) U.S. Cl. ...................................... 341/160; 711/158
(58) Field of Search .................... 341/160, 24; 711/158, 711/108; 710/244

(56) References Cited

U.S. PATENT DOCUMENTS

| | | | |
|---|---|---|---|
| 4,346,369 A | * | 8/1982 | Macy .......................... 341/24 |
| 4,348,741 A | | 9/1982 | McAlister et al. |
| 4,845,668 A | | 7/1989 | Sano et al. |
| 4,887,084 A | | 12/1989 | Yamaguchi |
| 4,928,260 A | | 5/1990 | Chuang et al. |
| 5,014,195 A | | 5/1991 | Farrell et al. |
| 5,123,105 A | | 6/1992 | Wyland et al. |
| 5,160,923 A | | 11/1992 | Suguwara et al. |
| 5,265,258 A | | 11/1993 | Fiene et al. |
| 5,321,640 A | | 6/1994 | Anderson et al. |
| 5,511,222 A | | 4/1996 | Shiba et al. |
| 5,555,397 A | * | 9/1996 | Sasama et al. .............. 711/158 |
| 5,602,545 A | | 2/1997 | Ishii et al. |

OTHER PUBLICATIONS

Schultz et al., "Fully Parallel Integrated CAM/RAM Using Preclassification to Enable Large Capacities", *IEEE Journal of Solid–State Circuits*, vol. 31, No. 5, May 1996.

* cited by examiner

*Primary Examiner*—Peguy Jeanpierre
*Assistant Examiner*—Jean Bruner Jeanglaude
(74) *Attorney, Agent, or Firm*—Bradley T. Sako

(57) ABSTRACT

A combinational encoder (100) according to one embodiment is disclosed. The combinational encoder (100) can be used with an address encoder (300) to provide a compact priority encoder. The combinational encoder (300) receives a number of input signals (MATCH_IN0–MATCH_IN3) and provides a like number of output signals (MATCH_OUT0–MATCH_OUT3). Unlike a conventional priority encoder, which activates a single output signal in response to various input signal combinations, the combinational encoder (100) provides multiple active output signals in response to particular combinations of input signals. When applied to an appropriate address encoder (300), the multiple active output signals generate address values reflecting the desired priority of the input signals.

20 Claims, 9 Drawing Sheets

FIG. 2

| X0 | 0 | 1 | 0 | 0 | 0 | 1 | 0 | 1 | 0 | 1 | 0 | 0 | 0 | 1 | 0 | 1 |
|---|---|---|---|---|---|---|---|---|---|---|---|---|---|---|---|---|
| X1 | 0 | 0 | 0 | 1 | 1 | 0 | 0 | 0 | 1 | 0 | 0 | 0 | 1 | 0 | 0 | 1 |
| MATCH_OUT0 | 1 | 0 | 1 | 0 | 1 | 0 | 1 | 0 | 1 | 0 | 1 | 0 | 1 | 0 | 1 | 0 |
| MATCH_OUT1 | 1 | 1 | 0 | 0 | 1 | 1 | 0 | 0 | 1 | 1 | 0 | 0 | 1 | 1 | 0 | 0 |
| MATCH_OUT2 | 0 | 0 | 1 | 1 | 0 | 0 | 0 | 0 | 0 | 1 | 1 | 0 | 0 | 0 | 0 | 0 |
| MATCH_OUT3 | 1 | 1 | 1 | 1 | 1 | 1 | 0 | 0 | 0 | 0 | 0 | 0 | 0 | 0 | 0 | 0 |
| MATCH_IN0 | 0 | 1 | 0 | 1 | 0 | 1 | 0 | 1 | 0 | 1 | 0 | 1 | 0 | 1 | 0 | 1 |
| MATCH_IN1 | 0 | 0 | 1 | 1 | 0 | 0 | 1 | 1 | 0 | 0 | 1 | 1 | 0 | 0 | 1 | 1 |
| MATCH_IN2 | 0 | 0 | 0 | 0 | 1 | 1 | 1 | 1 | 0 | 0 | 0 | 0 | 1 | 1 | 1 | 1 |
| MATCH_IN3 | 0 | 0 | 0 | 0 | 0 | 0 | 0 | 0 | 1 | 1 | 1 | 1 | 1 | 1 | 1 | 1 |

PRIORITY SELECTION CIRCUIT

TECHNICAL FIELD

The present invention relates generally to priority selection circuits and more particularly to combinational encoder circuits that can be utilized with address encoders to generate priority selection addresses.

BACKGROUND OF THE INVENTION

Priority selection circuits typically receive a number of input signals that can have active and inactive levels. When multiple active input signals are received, the priority selection circuit selects one of the active input signals according to predetermined criteria. For example, input signals may have a particular order, and a priority selection circuit can always select the lowest active input signal in the particular order.

One particular application for priority selection circuits is in content addressable memories (CAMs). A CAM can include an array of CAM cells that compare stored values to an applied comparand value, and in the event there is a match, activate a match indication. A priority selection circuit will select among the multiple match indications to generate single match indication. In CAM applications, priority among multiple match indications can be established according to the physical location of the CAM cells. As just one example, priority can be given to the match indication corresponding to a lowest physical address for the CAM cell array.

In addition to a priority selection circuit, many CAMs will also include an address encoder. An address encoder receives a match signal having priority, and generates an address value from the match signal. The address signal can then be used to access data that corresponds to the match indication. In this way, a CAM will receive a comparand value and generate match signals. The CAM will then determine priority from the match signals, generate an address from a priority match signals, and finally provide output data according to the address.

To better understand the structure and operation of priority encoder circuits and address encoder circuits, a number of conventional circuits will be described.

Referring now to FIG. 8, a conventional priority selection circuit is set forth in a schematic diagram. The conventional priority selection circuit is designated by the general reference character 800, and is shown to include a number of input inverters 802, 804, 806, and 808. Each input inverter (802–808) receives a corresponding input signal, shown as MATCH_IN0–MATCH_IN3. The input signals (MATCH_IN0–MATCH_IN3) of FIG. 8 are active when at a logic low, and inactive when at a logic high. The output of inverter 802 is applied as an input to another inverter 810.

The various input signals are also applied to disable gates, shown as items 812, 814 and 816. The disable gates (812, 814 and 816) will provide a disabling output, which results in an inactive output signal, or alternatively, provide an enabling output which can result in an active output signal. Each disable gate (812, 814 and 816) receives a corresponding input signal by way of an input inverter. In addition, each disable gate (812, 814 and 816) also receives all previous inputs in non-inverted form. Thus, disable gate 812 receives input signal MATCH_IN1 by way of inverter 804 as well as previous input signal MATCH_IN0. Similarly, disable gate 816 receives input signal MATCH_IN3 by way of inverter 808 as well as previous input signals MATCH_IN0, MATCH_IN1 and MATCH_$_{IN}$2. The disable gate arrangement of FIG. 8 results in the priority selection of input signals (MATCH_IN0–MATCH_IN3) according to order of the signals. If MATCH_IN0 is active (low), the output of disable gates 812, 814, and 816 will all be high, regardless of whether the remaining input signals (MATCH_IN1–MATCH_IN3) are high or low. Similarly, provided MATCH_IN0 is inactive (high), if MATCH_IN1 is active (low), the output of disable gates 814 and 816 will be high, regardless of whether or not the input signals MATCH_IN2 or MATCH_IN3 are high or low. Finally, provided MATCH_IN0 and MATCH_IN1 are inactive (high), if MATCH_IN2 is active (low), the output of disable gate 816 will be high, regardless of whether or not the input signal MATCH 3 is high or low.

The priority selection circuit 800 also includes output gates 818, 820, 822, and 824. The output gates (818–824) each provide a corresponding output signal, shown as MATCH_OUT0–MATCH_OUT3. The outputs gates (818–824) can each receive a "prior hit" signal (PRIOR_HIT). The PRIOR_HIT signal indicates whether or not an input signal (not shown) having an even higher priority is active. Thus, when the PRIOR_HIT signal is active (high) the outputs of the output gates (818–824) will be low, regardless of the logic of the input signals (MATCH_IN0–MATCH_IN3).

Also set forth in FIG. 8 is a local hit indicator circuit 826. The prior hit generator 826 generates a local hit signal (LOCAL_HIT). The LOCAL_HIT signal can be used to generate a prior hit signal for subsequent priority selection circuits. The LOCAL_HIT signal will be active whenever one of the input signals (MATCH_IN0–MATCH_IN3) is active. In the particular arrangement of FIG. 8, the LOCAL_HIT signal is active when low, and the local hit indicator circuit 826 includes a NAND gate 828 and an inverter 830. The NAND gate 828 receives each input signal (MATCH_IN0–MATCH_IN3) as an input. The output of NAND gate 828 is inverted by inverter 830 to generate the LOCAL_HIT signal.

While the conventional priority selection circuit of FIG. 8 provides one way of selecting from among four input signals, such an approach may not be desirable due to the number of transistors required to implement the device. This may be particularly true for devices that must establish priority from among a large number of input signals. As just one example, the circuit of FIG. 8 would have to be repeated 32 times for 128 input signals.

Circuit implementations that require a large numbers of transistors can be undesirable as a larger number of transistors can require more area on an integrated circuit. Additional area can translate directly into increased cost for each integrated circuit. Further, the number of interconnections required in a circuit can also impact area, as certain interconnections can require the formation of a contact within the integrated circuit. Accordingly, it is almost always desirable to provide a given functionality with as low a number of transistors as possible.

Referring now to FIG. 9, another conventional priority selection circuit is set forth in a schematic diagram. The priority selection has the same functionality as that set forth in FIG. 8, but reduces transistor count by essentially merging the logic functions of the inverters and disable gates. The circuit of FIG. 9 is described in "Fully Parallel Integrated CAM/RAM Using Preclassification to Enable Large Capacities," *IEEE Journal of Solid-State Circuits*, Vol. 31, No. 5, May 1996, by Schultz and Gulak. Like the example of FIG. 8, the circuits of FIG. 9 can be considered to operate like a carry-look-ahead adder circuit, the LOCAL_HIT signal providing the carry signal. The circuit of FIG. 9 is implemented with complementary metal-oxide-semiconductor (CMOS) gates, and so includes 38 transistors.

To better understand the operation of the conventional priority selection circuits of FIGS. 8. and 9, a truth table is set forth in FIG. 10. Included in FIG. 10 are the various combinations of input values MATCH_IN3–MATCH_IN0 and the resulting output values MATCH_OUT3–MATCH_OUT0. As shown by FIG. 10, for each of the various input signal combinations (MATCH_IN3–MATCH_IN0) only one output signal (MATCH_OUT3–MATCH_OUT0) will be active. The. one active output signal (MATCH_OUT3–MATCH_OUT0) will correspond to the lowest order input signal. For example, when the MATCH_IN3–MATCH_IN0 signal equals "0000," the output signals MATCH_OUT3–MATCH_OUT0 are 0001, reflecting that the lowest active input signal is the MATCH_IN0 signal. When the MATCH_IN3–MATCH_IN0 signal equals "1001," the output signals MATCH_OUT3–MATCH_OUT0 are 0010, reflecting that the lowest active input signal is the MATCH_IN1 signal.

In this way, the conventional priority selection circuits described receive multiple inputs signals, one or more of which can be active, and provides multiple outputs, only one of which is active.

Also set forth in FIG. 10 are address signals X1 and X0 generated from the output signals MATCH_OUT3–MATCH_OUT0. Such signals may be generated by an address encoder circuit (not shown).

Referring now to FIG. 11, a schematic diagram of a third conventional priority selection circuit is set forth. The priority selection circuit of FIG. 11 illustrates the same approach as FIG. 9, but for a case in which eight input signals (MATCH_IN0–MATCH_IN7) are received and eight output signals are provided (MATCH_OUT0–MATCH_OUT7). As illustrated by FIG. 11, as the number of input signals increases, the transistor count for the circuit increases correspondingly. Thus, with conventional approaches, increases in input signal numbers can result in priority selection circuits having increased complexity and size. In FIG. 11, an approach implemented in CMOS includes 92 transistors.

It would be desirable to provide an approach to priority selection circuits that does not require as many transistors as conventional approaches, while at the same time maintaining a relatively fast operating speed.

SUMMARY OF THE INVENTION

According to the disclosed embodiments, priority encoding of a number of input signals is accomplished by utilizing a novel combinational encoder with an address encoder. Unlike a conventional priority encoder, which provides a single active output signal in response to various combinations of input signals, the novel combinational encoder provides multiple active output signals for certain combinations of input signals. Such multiple active output signals include one active output signal indicating proper priority, as well as other output signals that can be considered to be extraneous. An address encoder provides a response which essentially "ignores" the extraneous active output signals, thereby providing an address value that reflects the proper priority of the input signals.

An advantage of the disclosed embodiments is that a priority encoded address value can be generated by a more compact circuit.

Another advantage of the disclosed embodiments is that a priority encoded address value can be generated with a lower transistor count circuit.

Yet another advantage of the disclosed embodiments is that a compact circuit size can still be maintained as the number of input signals is scaled up.

Yet another advantage of the disclosed embodiments is that an address encoder used to generate the priority encoded address can work with both a conventional priority encoder as well as the disclosed novel combinational encoders. Accordingly, the disclosed combinational encoder may be easily integrated into an existing priority encoding approach.

Yet another advantage of the embodiments is that priority selection can be accomplished according to lowest physical location of an input signal. Thus, the embodiments can be utilized in content addressable memories to establish priority among multiple match signals.

Yet another advantage of the disclosed embodiments is that a more compact priority selection circuit is provided that maintains the relatively fast operating speeds of conventional priority selection circuits.

Yet another advantage of the disclosed embodiments is that a more compact priority selection circuit is provided that provides a local hit indication and also can be disabled by a "prior hit" signal. Such features can allow multiple embodiments to used together to establish priority among a relatively large number of input signals.

BRIEF DESCRIPTION OF THE DRAWINGS

FIG. 2 is a truth table illustrating the response of the first embodiment.

FIG. 5 is a truth table illustrating the response of the second embodiment.

FIG. 10 is a truth table illustrating the response of the conventional priority selection circuits set forth in FIG. 9 and 10.

DETAILED DESCRIPTION OF THE EMBODIMENTS

Various embodiments will now be described in conjunction with a number of schematic diagrams and logic tables. The embodiments set forth an approach to priority selection circuits that may be used in conjunction with address encoder circuits to produce priority selection results.

Figure 1:
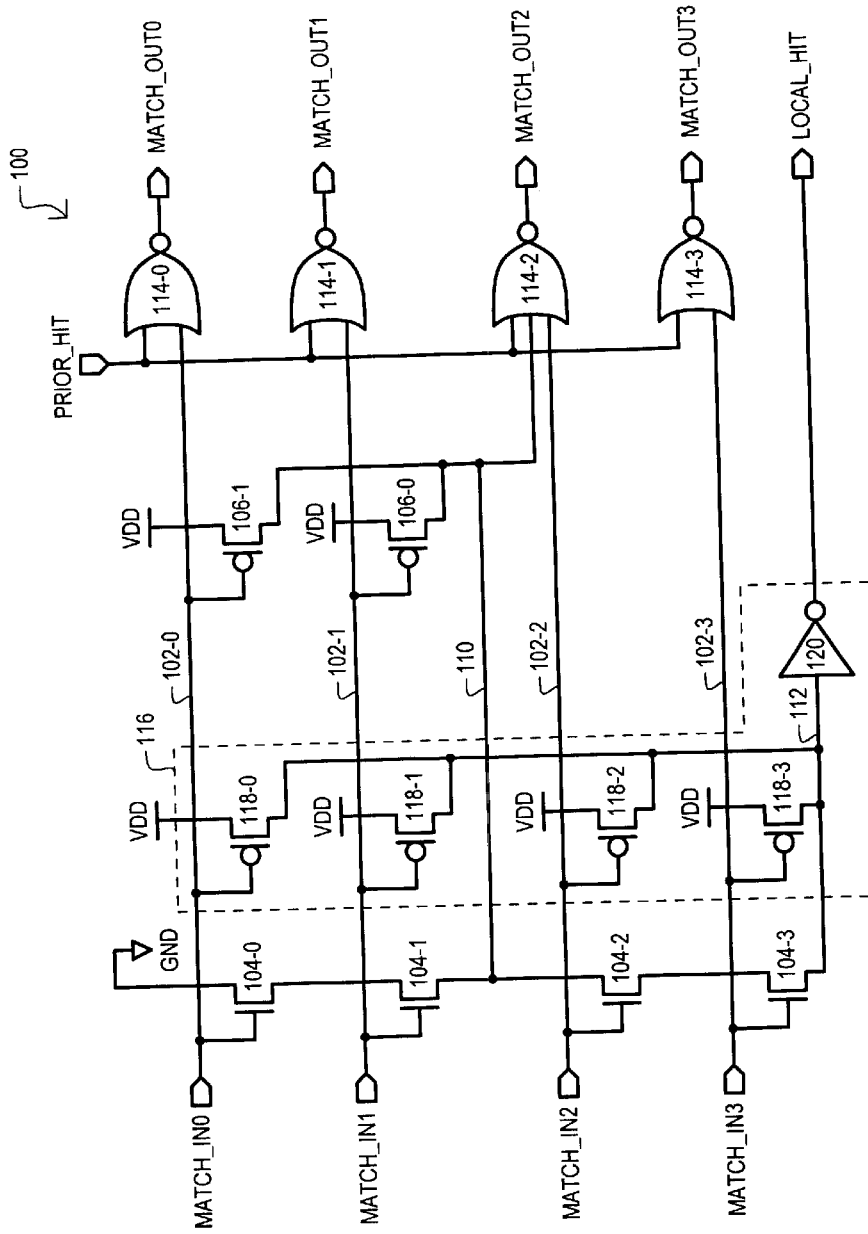
FIG. 1 is a schematic diagram of a first embodiment.

Referring now to FIG. 1, a schematic diagram is set forth illustrating a combinational selection circuit according to a first embodiment. The first embodiment is designated by the general reference character 100 and is shown to receive a number of input signals MATCH_IN0–MATCH_IN3 on a number of input lines 102-0 to 102-3. In response to the various combination of input signal (MATCH_IN0–MATCH_IN3) values, a variety of output signals (MATCH_OUT0–MATCH_OUT3) are generated. Unlike conventional approaches, the resulting output signals (MATCH_OUT0–MATCH_OUT3) provided by the first embodiment 100 do not always result in a single output being active for each given combination of input signals.

The first embodiment 100 is shown to include a number of "pull-down" devices (104-0 to 104-3) that can assist in establishing a first logic level on various nodes. Also included are two "pull-up" devices (106-0 and 106-1) for establishing a second logic level on various nodes.

In the particular arrangement of FIG. 1, the pull-down devices (104-0 to 104-3) are n-channel insulated gate field effect transistors (IGFETs, e.g. "MOS" transistors). The source-drain paths of pull-down devices (104-0 and 104-1) are arranged in series between a first logic level (GND) and a disable node 110. The source-drain paths of the other two pull-down devices (104-0 and 104-1) are arranged in series between the disable node 110 and a local hit node 112. The gates of pull-down devices 104-0 to 104-3 are coupled to input lines 102-0 to 102-3, respectively. Accordingly, when the input signals MATCH_IN0 and MATCH_IN1 are both inactive (high), the disable node 110 will be driven to an active (low) logic level. Further, when all of the input signals MATCH_IN0–MATCH_IN3 are at an inactive level (high), in addition to driving the disable node 110 to an active level (low), the local hit node 112 is also driven to an inactive level (low).

The pull-up devices 106-0 and 106-1 are p-channel IGFETs having source-drain paths arranged in parallel between the second logic level (VDD) and the disable node 110. The gates of pull-up devices 106-0 and 106-1 are coupled to input lines 102-0 and 102-1, respectively. In this arrangement, when either of the input signals MATCH_IN0 or MATCH_IN1 is active (low), the disable node 110 is driven to an inactive level (high).

The first embodiment 100 further includes a number of output gates 114-0 to 114-3. In the particular implementation of FIG. 1, the output gates (114-0 to 114-3) are NOR gates, with output gates 114-0 to 114-3 providing output signals MATCH_OUT0–MATCH_OUT3, respectively. For the circuit of FIG. 1, the output signals (MATCH_OUT0–MATCH_OUT3) are active when high and inactive when low.

The output gates 114-0 to 114-3 each have an input coupled to a corresponding input line (102-0 to 102-3). Due to this arrangement, input signals MATCH_IN0–MATCH_IN3 can be considered to correspond with output signals MATCH_OUT0–MATCH_OUT3, respectively. Input signals MATCH_IN0, MATCH_IN1 and MATCH_IN2 can be considered to be "non-corresponding" input signals with reference to output signal MATCH_OUT3.

Each output gate (114-0 to 114-3) also receives a prior hit signal PRIOR_HIT as another input. The PRIOR_HIT signal can indicate that another input signal (not shown) having a higher priority is active. Accordingly, if the PRIOR_HIT signal is active (high), the output gates (114-0 to 114-3) will be disabled, and thus, only provide inactive (low) output signals. Output gate 114-2 has a third input coupled to the disable node 110. In this arrangement, when the disable node is at an inactive level (high), the output gate 114-2 will only output an inactive (low) output signal (MATCH_OUT2).

The first embodiment 100 further includes a local hit detector 116. The local hit detector 116 provides a local hit signal LOCAL_HIT that is active (low) when any of the input signals MATCH_IN0–MATCH_IN3 is active (low). The local hit detector 112 is shown to include the local hit node 112 as well as a number of detect devices 118-0 to 118-3. In the particular example of FIG. 1, the detect devices are p-channel IGFETs having source-drain paths arranged in parallel between the second. logic level and the local hit node 112. in this arrangement, when any of the input signals (MATCH_IN0 to MATCH_IN3) is low, the local hit node 112 is driven to the second logic level. The local hit node 112 is inverted by an inverter 120 that provides the LOCAL_HIT signal as an output.

The ability of the first embodiment 100 to process a PRIOR_HIT signal and provide a LOCAL_HIT signal allows multiple first embodiments 100 to be utilized together to generate match indications for larger numbers of input signals. For example, a local hit indication from one circuit may be used to generate a prior hit signal for subsequent such circuits.

Figure 2:
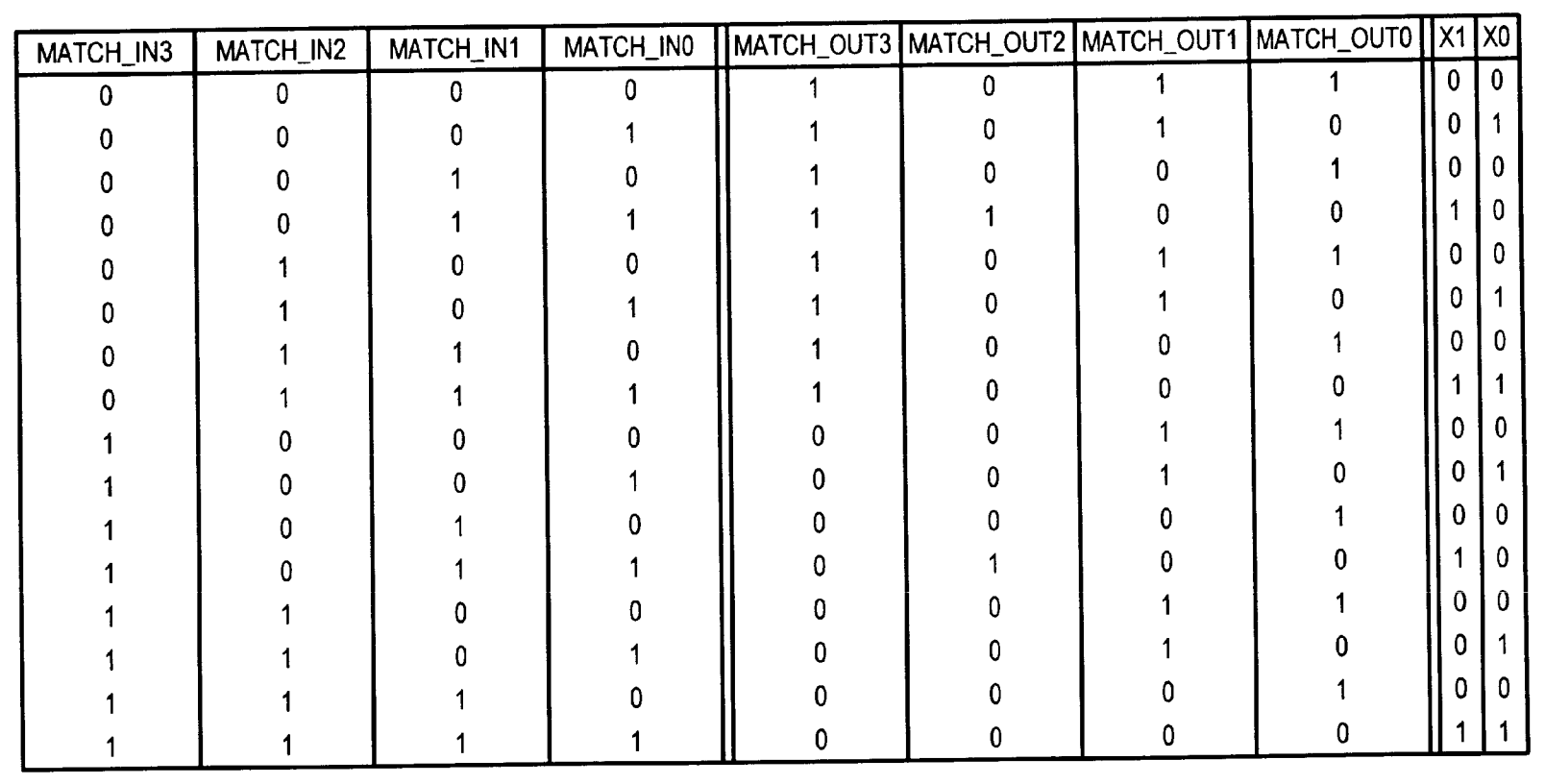

To better understand the operation of the first embodiment 100 a truth table is set forth in FIG. 2 illustrating the response of thee first embodiment 100. FIG. 2 sets forth the various output signal values (MATCH_OUT3–MATCH_OUT0) that result from the possible combinations of input signals values (MATCH_IN3–MATCH_IN0). Unlike conventional priority selection circuits, the first embodiment 100 generates output values having multiple active signals. In particular, the first seven input value combinations (0000–0110) all provide more than one active (high) output signal. In addition, the input value combinations 1000 and 1100 also provide multiple active output signals.

The unique generation of output signals according to the first embodiment 100 can be used to provide priority selected output signals by applying the output signals to an appropriate address encoder. An appropriate address encoder would ignore active signals of lower priority, providing an address value that reflects the highest priority active signal. For example, for MATCH_OUT3–MATCHOUT0 values of 1011, the address "00" is provided, essentially "ignoring" the lower priority active signals MATCH_OUT3 and MATCH_OUT1, and only responding to the MATCH_OUT0 active value. As another example, for MATCH_OUT3–MATCH0 values of 1100, the address "10" is provided, essentially ignoring the lower priority active signals MATCH_OUT3 and only responding to the MATCH_OUT2 active value.

It is understood that the first embodiment 100 establishes priority according to the lowest input signal value. That is, MATCH_IN0 has priority over MATCH_IN1, which has priority over MATCH_IN2, which has priority over MATCH_IN3. This makes the circuit particularly applicable to CAM applications. However, one skilled in the art could use the approach of the first embodiment 100 to establish some other arbitrary prioritizing among the input signals.

Figure 11:
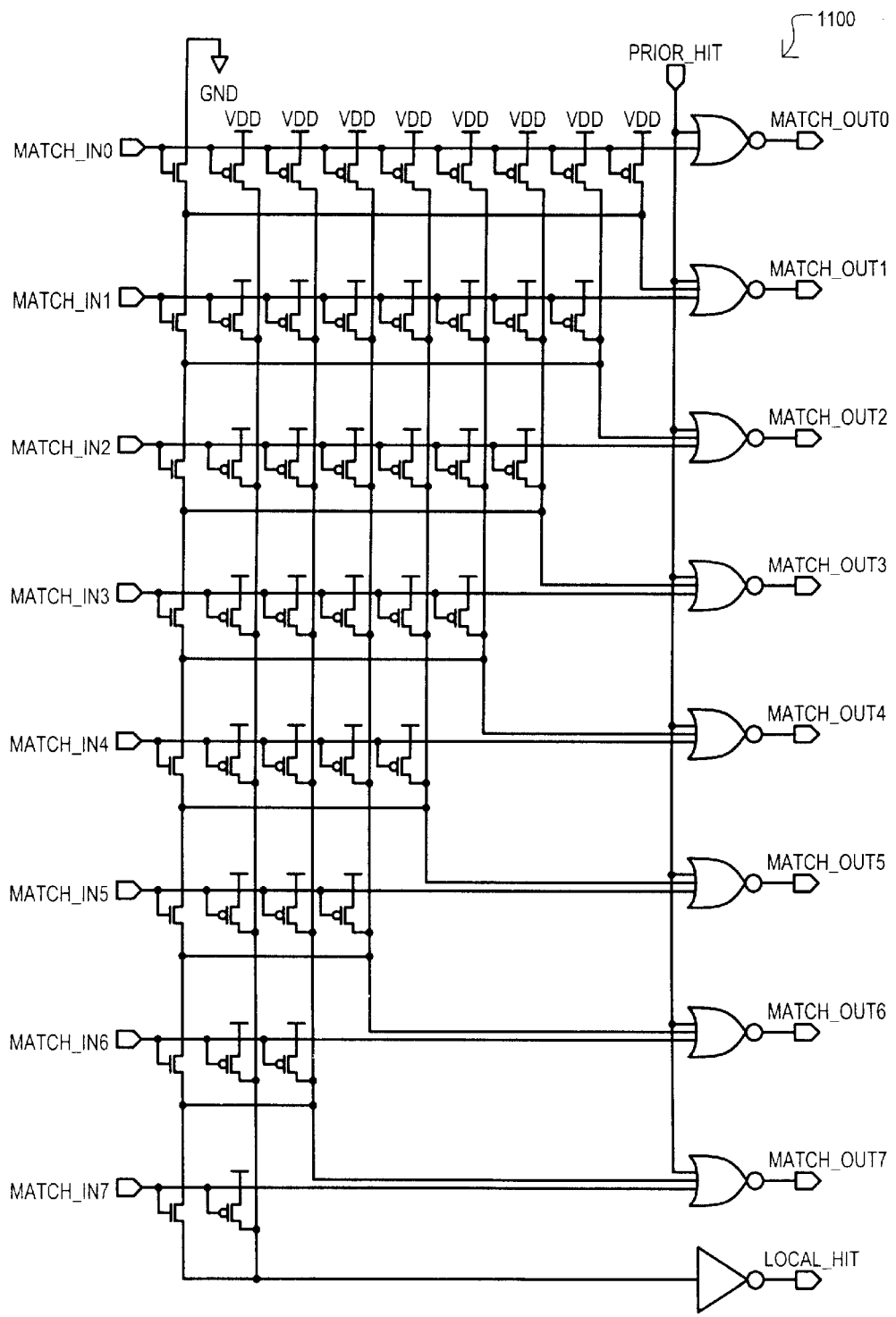
FIG. 11 is a schematic diagram of a third conventional priority selection circuit.

One way to conceptualize the first embodiment 100 is to note that each input signal (MATCH_IN0–MATCH_IN3) is applied to a corresponding output gate (114-0 to 114-3) to effect an output signal (MATCH_OUT0–MATCH_OUT3). Thus, output gates 114-0, 114-1 and 114-3 can be considered to be enabled by corresponding input signals MATCH_IN0, MATCH_IN2 and MATCH_IN3. At the same time, output gate 114-2 can be disabled by non-corresponding input signals MATCH_IN0 and MATCH_IN1 by operation of pull-up devices 106-0 and 106-1. This arrangement is in contrast to conventional approaches, such as those set forth in FIGS. 8, 9 and 11, which disable output gates according to all previous non-corresponding input signals.

Figure 3:
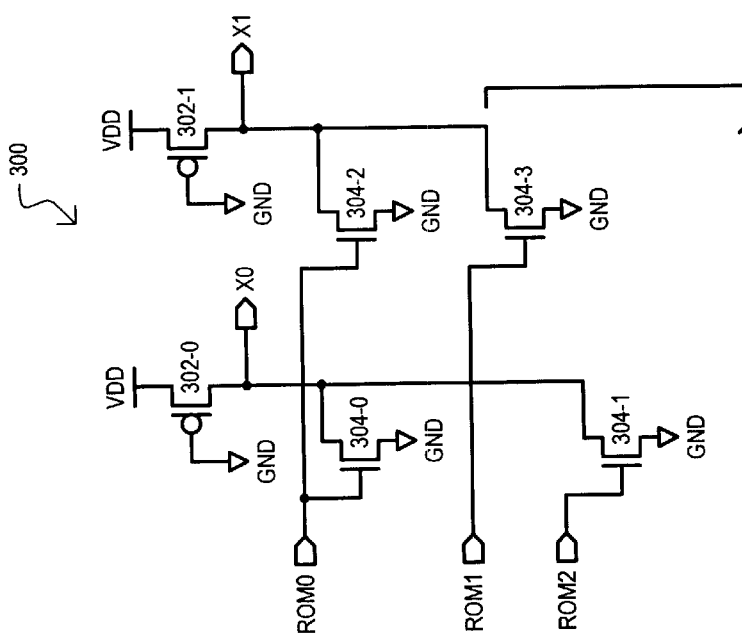
FIG. 3 is a schematic diagram of an address encoder that may be used in combination with the first embodiment.

An example of an address encoder that may be used with the first embodiment 100 is set forth in FIG. 3. The address encoder is designated by the general reference character 300, and can be conceptualized as a read-only-memory (ROM) type encoder. The address encoder 300 is shown to receive a number of encoder inputs ROM0–ROM3 and provide a two-bit address output, including a first address bit X0 and a second address bit X1. When utilized in conjunction with a priority selection circuit, the encoder inputs ROM3–ROM0 can receive priority selection outputs MATCH_OUT3–MATCH_OUT0, respectively.

The address encoder 300 is shown to include default logic devices 302-0 and 302-1 and logic establishing devices 304-0 to 304-3. The default logic devices (302-0 and 302-1) will place the address bits (X1 and X0) at a default logic value (high) in the absence of the logic establishing devices (304-0 to 304-3) being activated. In the circuit of FIG. 3 the logic establishing devices (302-0 and 302-1) are p-channel IGFETs having gates commonly connected to a logic low value (GND). The source-drain path of logic establishing device 302-0 is coupled between a high logic value (VDD) and the first address bit X0. In a similar arrangement, the source-drain path of logic establishing device 302-1 is coupled between a high logic value (VDD) and second address bit X1.

Logic establishing devices 304-0 and 304-1 will place the address bit X0 at a non-default (low) logic value in response to various input signals. In particular, if encoder input ROM0 or ROM2 are active (high), the first address bit X0 will be driven low. In the circuit of FIG. 3, logic establishing devices 304-0 and 304-1 are n-channel IGFETs having source-drain paths coupled between the address bit X0 and a low logic value (GND). The gate of logic establishing device 304-0 is coupled to the encoder input ROM0, and the gate of logic establishing device 304-1 is coupled to the encoder input ROM2.

In a similar arrangement to logic establishing devices 304-0 and 304-1, logic establishing devices 304-2 and 304-3 will place the address bit X1 at the non-default (low) logic value in response to various input signals. In particular, if encoder input ROM0 or ROM1 are active (high), the second address bit X1 will be driven low. In the circuit of FIG. 3, logic establishing devices 304-0 and 304-1 are n-channel IGFETs having source-drain paths coupled between the address bit X1 and a low logic value. The gate of logic establishing device 304-2 is coupled to the encoder input ROM0, and the gate of logic establishing device 304-3 is coupled to the encoder input ROM1.

Figures 8, 9:
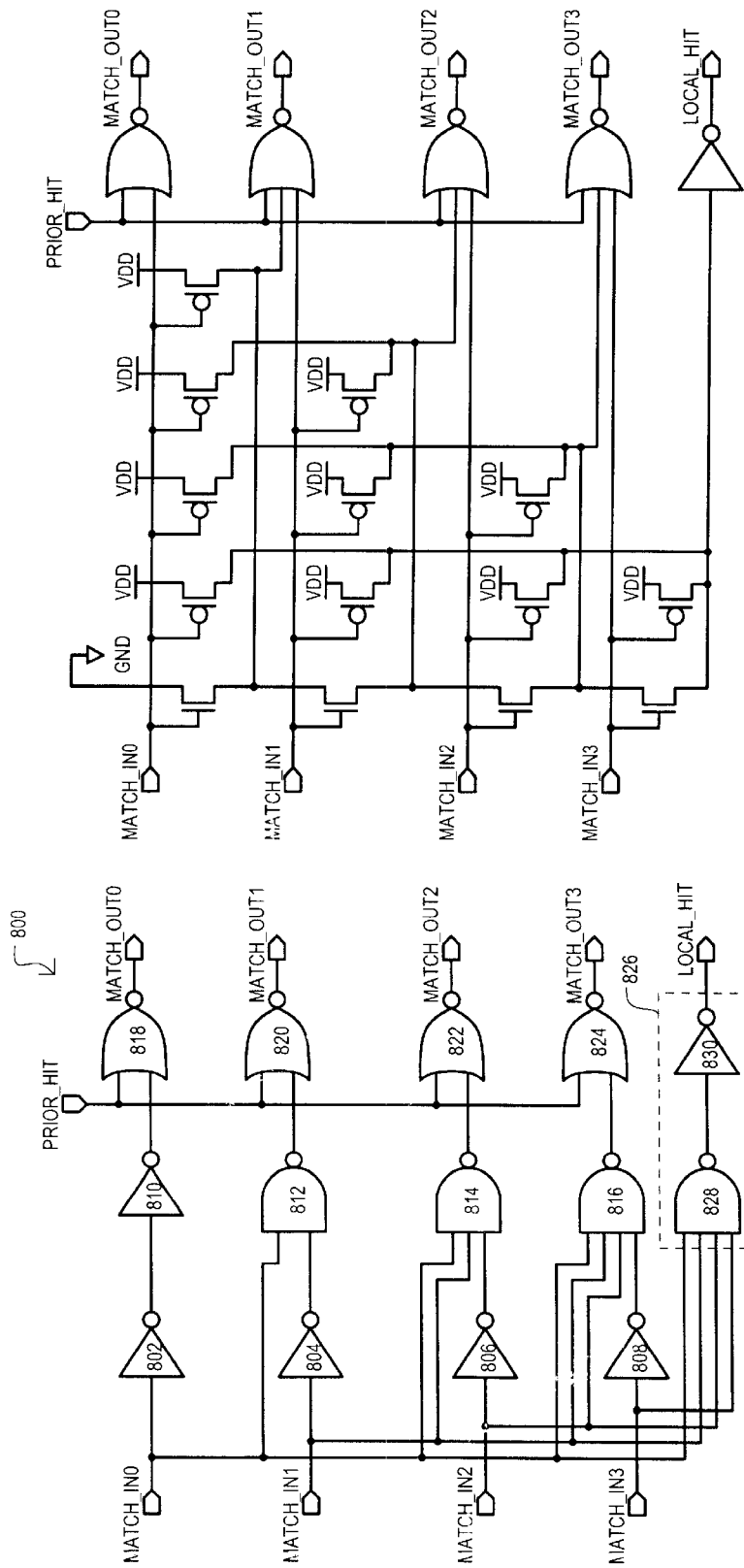
FIG. 8 is a schematic diagram of a first conventional priority selection circuit.
FIG. 9 is a schematic diagram of a second conventional priority selection circuit.
Figure 10:
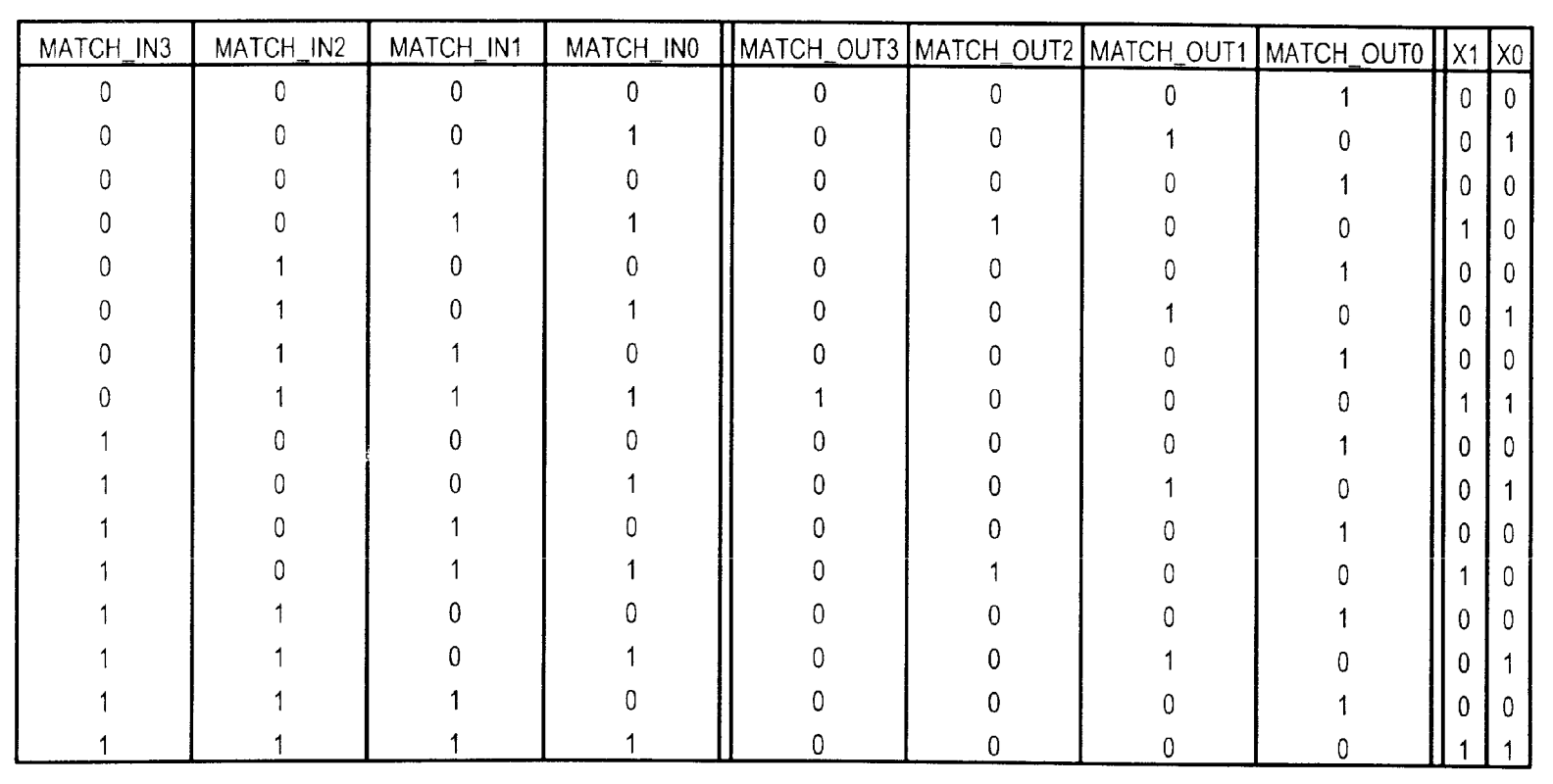

It is noted that the address encoder set forth in FIG. 3 can be used in conjunction with the conventional priority selection circuits set forth in FIGS. 8 and 9. In such an arrangement, the address encoder 300 will produce the address outputs set forth in FIG. 10. Advantageously, the address encoder 300 will also produce the address outputs set forth in FIG. 2. In this way, the first embodiment 100 can be used in conjunction with an address encoder 300 to provide a priority selection address output (X1 and X0). If used in a content addressable memory (CAM), the address output (X1 and X0) can be used to select a data value corresponding to a match indication. Given N input values, the address encoder can thus provide a $\log_2 N$ address value. The $\log_2 N$ address value can be readily used to access stored data, as in many CAM architectures.

It is understood that the particular address encoder of FIG. 3 should not be construed as limiting the invention thereto.

The address encoder 300 represents but one example of a ROM encoder. There are many possible implementations of a ROM encoder. It is noted that alternate ROM encoders may be capable of receiving multiple active inputs, but still provide a properly prioritized address output. In such a case, a priority selection circuit, such as that set forth in FIG. 1, can take advantage of such an encoder by providing multiple active outputs.

The combinational encoder circuit according to the first embodiment 100 provides a more compact implementation as it includes 30 transistors when implemented in a complementary transistor technology, such as CMOS. This is in contrast to the conventional priority selection circuit of FIG. 9, which was shown to include 38 transistors.

Referring once again to FIG. 1, it is noted that transistor 106-1 serves to prevent disable node 110 from floating. Alternate approaches could utilize different methods to establish the logic at a disable node. Once such alternate approach is set forth in FIG. 4.

Figure 4:
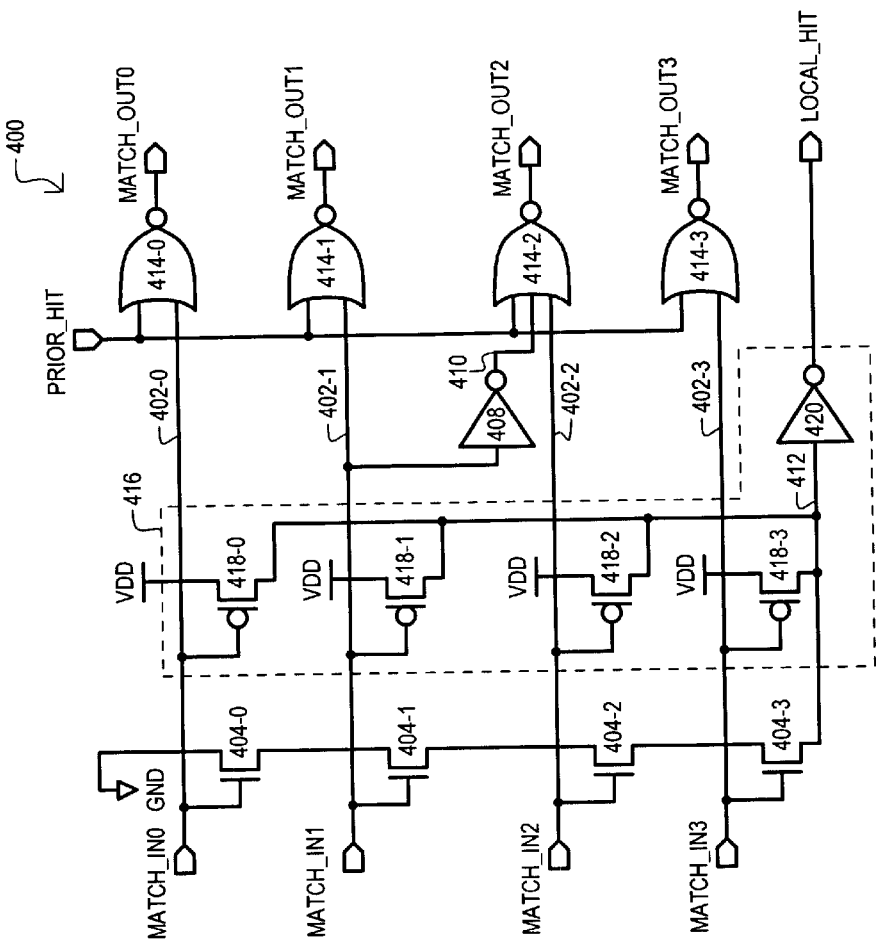
FIG. 4 is a schematic diagram of a second embodiment.

FIG. 4 is a schematic diagram of a second embodiment. The second embodiment is designated by the general reference character 400, and is shown to receive four input signals MATCH_IN0–MATCH_IN3 and provide four corresponding output signals MATCH_OUT0–MATCH_OUT3. The second embodiment 400 can be conceptualized as including some of the same constituents as the first embodiment 100. To that extent, like constituents will be referred to by the same reference character, but with the first numeral being a "4" instead of a "1."

The second embodiment 400 includes input lines (402-0 to 402-3), pull-down devices (404-0 to 404-3), a disable node 410, a local hit node 412, output gates (414-0 to 414-3), and a local hit detector 416. The local hit detector 416 includes detect devices (418-0 to 418-3) and an inverter 420.

An alternate way of conceptualizing the second embodiment 400 is to note that pull-down devices (404-0 to 404-3) and detect devices (418-0 to 418-3) form a NAND gate for detecting active levels in the input signals MATCH_IN3–MATCH_IN0. Thus, the second embodiment 400 includes a logic gate that detects one or more active levels in the input signal, as well as a device (inverter 408) that disables an output gate (NOR gate 414-2) in response to a "non-corresponding" input value, or combination non-corresponding of input values.

Unlike the first embodiment 100, which utilizes pull-up devices 106-0 and 106-1 and pull-down devices 104-0 and 104-1 to establish the logic at the disable node 110, the second embodiment 400 utilizes a disable inverter 408 to establish the logic value at the disable node 410. As a consequence, the response of the second embodiment 400 differs from that of the first embodiment 100.

To better understand these differences, a truth table is set forth in FIG. 5. As shown in FIG. 5, for an input value combination (MATCH_IN3–MATCH_IN0) of "0010" and "1010" an output value (MATCH_OUT3–MATCH_OUT0) of "1101" and "0101" results. This is in contrast to the first embodiment 100 which provides output values of "1001" and "0001" for the same input values.

It is noted however, that the second embodiment 400 provides multiple active (high) output values. This, again, is in contrast to conventional approaches.

Also set forth in FIG. 5 are the address bit values X1 and X0 that will result from the outputs of the second embodiment 400 (MATCH_OUT3–MATCH_OUT0) being applied to the address encoder of FIG. 3. As shown by FIG. 5, the address values that result are priority encoded values (according to lowest order). In this way, the second embodiment 400, while providing multiple active outputs, will provide a priority encoded result when used in conjunction with an appropriate address encoder. The second embodiment 400 can provide savings in area, as it includes 30 transistors in a CMOS implementation.

Figure 6:
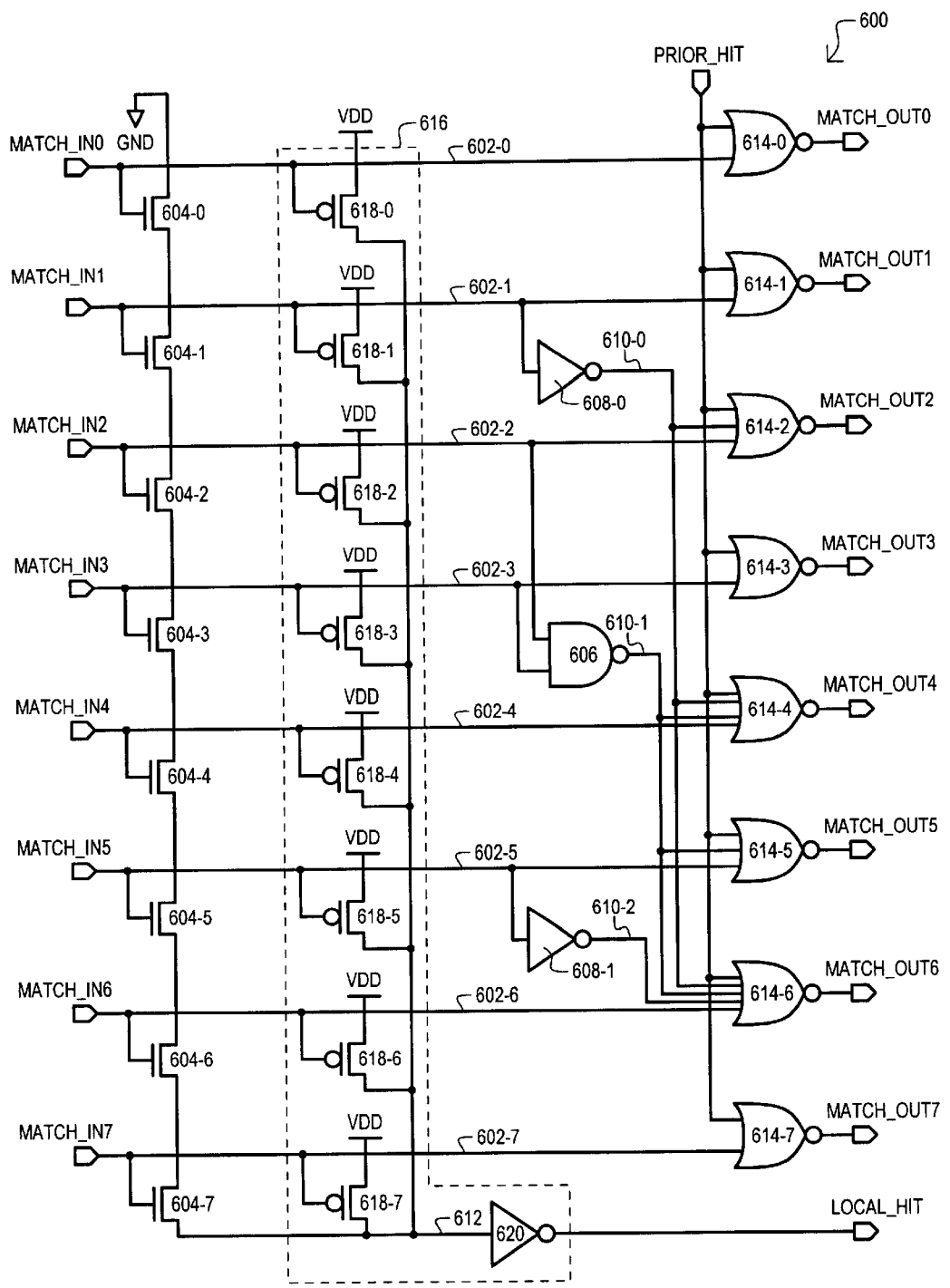
FIG. 6 is a schematic diagram of a third embodiment.

Referring now to FIG. 6, a schematic diagram of a third embodiment is set forth. The third embodiment is designated by the general reference character 600 and generally follows the approach set forth in FIG. 4, but receives 8-input values and provides 8-output values.

The third embodiment 600 includes many of the general constituents set forth in FIG. 4. To that extent, like elements will be referred to by the same reference character, but with the first numeral being a "6" instead of a "4." The third embodiment 600 is thus shown to include eight input lines (602-0 to 602-7), eight corresponding pull-down devices (604-0 to 604-7), three disable nodes (610-0 to 610-2), a local hit node 612, eight output gates (614-0 to 614-7) and, local hit detector 616. The local hit detector 616 includes eight detect devices (618-0 to 618-7) and an inverter 620.

The third embodiment 600 further includes a first disable inverter 608-0, a second disable inverter 608-1, and a disable gate 606. The first disable inverter 608-0 drives disable node 610-0 according the logic on input line 602-1. The first disable node 610-0 is provided as one input to output gates 614-2, 614-4, and 614-6. Thus, when the MATCH_IN1 signal is active (low), output gates 614-2, 614-4, and 614-6 will be prevented from activating (driving high) the MATCH_OUT2, MATCH_OUT4, and MATCH_OUT6 output signals. In this way, non-corresponding input signal MATCH_IN1 can disable output gates 614-2, 614-4, and 614-6.

The second disable inverter 608-1 drives disable node 610-2 according the logic on input line 602-5. The disable node 610-2 is provided as one input to output gate 614-6. Thus, when the MATCH_IN5 signal is active (low), output gates 614-6 will be prevented from activating (driving high) the MATCH_OUT6 signal. In this way, non-corresponding input signal MATCH_IN5 can disable output gate 614-6.

Disable gate 606 drives disable node 610-1 according to the logic on input lines 602-2 and 602-3. The disable node 610-1 is provided as an input to output gates 614-4, 614-5 and 614-6. Because the disable gate 606 is a NAND gate, if either the MATCH_IN2 or MATCH_IN3 signals is active (low), the disable node 610-1 will be driven high. A high disable node 610-1 will prevent output gates 614-4, 614-5, and 614-6 from activating the MATCH_OUT4, MATCH_OUT5, and MATCH_OUT6 values. In this way, non-corresponding input signals MATCH_IN2 or MATCH_IN3 can disable output gates 614-4 to 614-6.

The third embodiment 600, unlike conventional approaches (such as that set forth in FIG. 11), provides a combination output that can include multiple active signals in response to particular combinations of input values. This allows the third embodiment 600 to be implemented with fewer transistors than a conventional approach. When implemented with CMOS logic, the third embodiment includes 72 transistors. This is in contrast to the conventional approach of FIG. 11, which includes 92 transistors.

When utilized with an appropriate address encoder, the third embodiment 600 can provide priority encoded address values. An example of one of the many possible address encoders that can be used in conjunction with the third embodiment 600 is set forth in FIG. 7.

Figure 7:
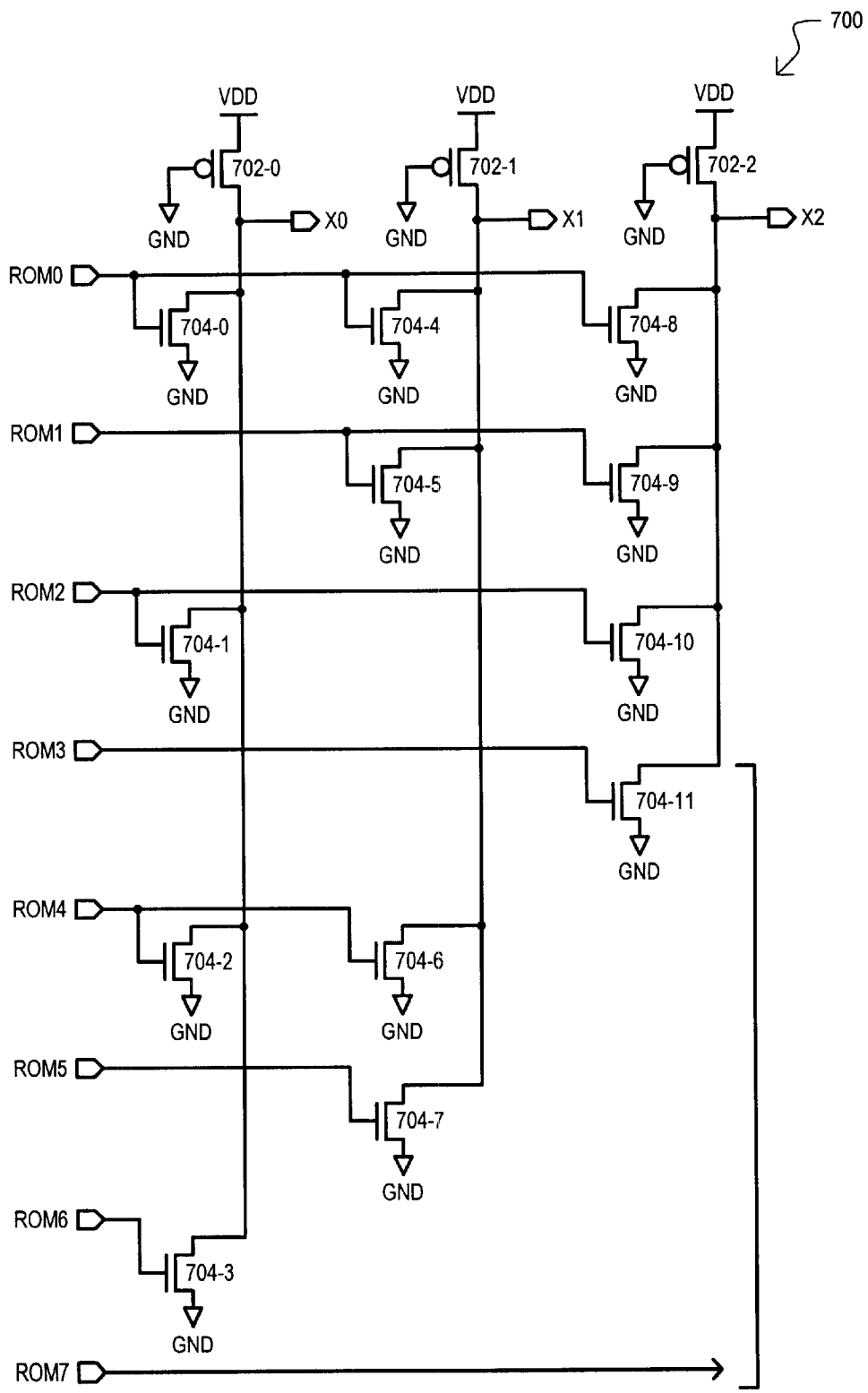
FIG. 7 is a schematic diagram of an address encoder that may be used in combination with the third embodiment.

The address encoder of FIG. 7 follows the general approach of the address encoder of FIG. 3, but instead of receiving four input values, eight input values (ROM0–ROM7) are received. The eight input values (ROM0–ROM7) are encoded into three address values X2, X1 and X0.

Referring now to FIG. 7, the address encoder 700 is shown to include default logic devices 702-0 and 702-2 and logic establishing devices 704-0 to 704-11. The default logic devices (702-0 to 702-2) will place the address bits (X2-X0) at a default logic value (high) in the absence of the logic establishing devices being activated. As in the case of the circuit of FIG. 3, the logic establishing devices (702-0 to 702-2) are p-channel IGFETs having gates commonly connected to a logic low value (GND). The source-drain paths of logic establishing devices 702-0 to 702-2 are coupled between a high logic value (VDD) and the address bits X2 to X0, respectively.

Logic establishing devices 704-0 to 704-3 will place the address bit X0 at a non-default (low) logic value in response to the input signals ROM0, ROM2, ROM4 and ROM6.

In particular, if any of the mentioned encoder inputs (ROM0, ROM2, ROM4 and ROM6) are active (high), the address bit X0 will be driven low. In the same general fashion, logic establishing devices 704-4 to 704-7 will place the address bit X1 at a non-default (low) logic value in response to the input signals ROM0, ROM1, ROM4 and ROM5. Similarly, logic establishing devices 704-8 to 704-11 will place the address bit X2 at a non-default (low) logic value in response to the input signals ROM0, ROM1, ROM2, and ROM3.

In this arrangement, an eight-bit input value that can have multiple active inputs, but be appropriately encoded to generate a desired priority encoded address. It is noted that the address encoder of FIG. 7 represents but one possible encoder that can function with the third embodiment 600.

It is also understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A circuit that receives a plurality of input signals and provides a priority selected address output, the circuit comprising:

a combinational encoder that receives the plurality of input signals and provides a plurality of output signals, the combinational encoder activating at least one output signal in response to each combination of input signals, and activating a plurality of output signals for selected combinations of input signals; and an address encoder that receives the output signals from the combinational encoder and provides address values, the address values being priority selected according to a predetermined priority of the input signals.

2. The circuit of claim 1, wherein:

the input signals have a predetermined order; and the predetermined priority provided by the address encoder corresponds to the predetermined physical order of the input signals.

3. The circuit of claim 1, wherein:

the combinational encoder includes a plurality of inputs lines, each input line receiving one of the input signals, and a plurality of output gates, each output gate driving an associated output signal between an active level and an inactive level according to values applied at corresponding gate inputs, each output gate having a gate input coupled to one of the input lines.

4. The circuit of claim 3, wherein:

the combination encoder includes
   at least one of the output gates is a disable output gate, the disable output gate having a gate input coupled to a disable node in addition to having a gate input coupled to an associated input signal, the disable output gate being prevented from driving its output signal to the active level when the disable node is at a disable level; and
   a disable device for driving the disable node to a disable level in response to another input signal.

5. The circuit of claim 4, wherein:

the disable device is an inverter.

6. The circuit of claim 4, wherein:

the disable device is a logic gate having a plurality of inputs coupled to the input lines and an output coupled to the disable node.

7. The circuit of claim 1, further including:

a local hit detector that provides a local hit signal, the local hit detector driving the local hit signal to an active level when one of the input signals is active.

8. The circuit of claim 7, wherein:

a local hit detector includes
   a local hit node, and
   a plurality of first devices coupled in parallel between a first logic level and the local hit node, each first device receiving an input signal and providing a low impedance path when its corresponding input signal is at an active level.

9. The circuit of claim 8, wherein:

the local hit detector further includes
   a plurality of second devices coupled in series between the second logic level and the local hit node, each second device receiving an input signal and providing a low impedance path when its corresponding input signal is at an inactive level.

10. A circuit that receives a plurality of input signals having a particular order and provides an address value corresponding to the lowest active input signal in the order, the circuit, comprising:

a combinational encoder circuit that receives N input signals and provides N corresponding output signals, where N is greater than three, the combinational encoder circuit providing an active output signal for the corresponding active input signal for at least three of the N input signals and corresponding output signals; and
   an address encoder circuit coupled to the combinational encoder circuit, the address encoder providing a number of address bits for each resulting combination of output signals, the address bits having a value that corresponds to the lowest active input signal.

11. The circuit of claim 10, wherein:

the number of address bits is equal to $\log_2 N$.

12. The circuit of claim 10, wherein:

the combinational encoder circuit includes a disable gate that drives one of the output signals between an active state and an inactive state the disable gate maintaining its output signal in the inactive state when a disable node is at a disable logic level.

13. The circuit of claim 12, wherein:

the combinational encoder circuit includes a plurality of first devices arranged in series between a first logic value and the disable node, each first device providing a low impedance path in response to a particular input signal.

14. The circuit of claim 12, wherein:

the combinational encoder circuit includes a plurality of second devices arranged in parallel between a second logic value and the disable node, each second device providing a low impedance path in response to a particular input signal.

15. The circuit of claim 10, wherein:

the combinational encoder circuit further includes a plurality of output gates that each receive an input signal and provide an output signal, each output gate further receiving a prior hit signal, the output gates providing inactive output signals when the prior hit signal is active.

16. A method for generating an address reflecting a priority among input signals, the method including:

receiving a plurality of input signals that can have active levels and inactive levels;
   generating one active output signal for certain combinations of the input signals, the one active output signal designating the input signal with the highest priority, and generating a plurality of active output signals for certain other combinations of input signals, one of the plurality of active output signals designating the input signal with the highest priority, the other of the plurality of active output signals being extraneous indications; and
   encoding the active output signals into an address value by generating an address value according to the active output signal that designates the input signal with the highest priority.

17. The method of claim 16, wherein:

receiving a plurality of input signals includes receiving input signals from a content addressable memory (CAM) cell array, each input signal indicating a match with predetermined CAM cells.

18. The method of claim 16, wherein:

generating one active output signal for certain combinations of the input signals and generating a plurality of active output signals for certain other combinations of input signals includes
   providing corresponding output signal and input signal pairs,
   generating an active output signal in response to a corresponding active input signal for certain output signals,
   generating an inactive output signal in response to a non-corresponding active input signal for certain other output signals.

19. The method of claim 16, further including:

activating a local hit indication when any of the input signals is active.

20. The method of claim 16, further including:
de-activating all output signals in response to a prior hit indication.

* * * * *

UNITED STATES PATENT AND TRADEMARK OFFICE
CERTIFICATE OF CORRECTION

PATENT NO. : 6,420,990 B1
APPLICATION NO. : 09/272710
DATED : July 16, 2002
INVENTOR(S) : Eric H. Voelkel It is certified that error appears in the above-identified patent and that said Letters Patent is hereby corrected as shown below:

IN THE SPECIFICATION
At column 2, line 1, please replace "MATCH$_{IN}$2" with -- MATCH_IN2 -- so that the corresponding phrase reads – MATCH_IN1 and MATCH_IN2 –.

Starting at column 6, line 46 and ending at column 6, line 47, please replace "MATCH$_{OUT}$2" with -- MATCH_OUT2 -- so that the corresponding phrase reads – responding to the MATCH_OUT2 –.

Signed and Sealed this

Twenty-seventh Day of May, 2008

JON W. DUDAS
*Director of the United States Patent and Trademark Office*